United States Patent [19]

Burkhead

[11] Patent Number: 5,220,204
[45] Date of Patent: Jun. 15, 1993

[54] VOLTAGE AND TEMPERATURE COMPENSATED EMITTER-FOLLOWER DRIVER

[75] Inventor: Lowell E. Burkhead, Springville, Iowa

[73] Assignee: Rockwell International Corporation, Seal Beach, Calif.

[21] Appl. No.: 705,232

[22] Filed: May 24, 1991

[51] Int. Cl.[5] .......................... H03K 12/00; H03K 3/01
[52] U.S. Cl. ..................................... 307/268; 307/275; 307/270
[58] Field of Search ............... 307/275, 584, 571, 300, 307/582, 270, 268

[56] References Cited

U.S. PATENT DOCUMENTS

| | | | |
|---|---|---|---|
| 3,005,958 | 10/1961 | Grant | 330/19 |
| 3,019,370 | 1/1962 | Basharrah | 307/275 |
| 3,029,398 | 4/1962 | McComb | 331/113 |
| 3,030,022 | 4/1962 | Gittleman | 235/195 |
| 3,036,225 | 5/1962 | Kladde | 307/275 |
| 3,076,100 | 1/1963 | Cowlin | 307/44 |
| 3,158,751 | 11/1964 | Nelson | 307/275 |
| 3,289,105 | 11/1966 | Funfstuck | 331/113 |
| 3,435,375 | 3/1969 | Miller, Jr. | 331/110 |
| 3,986,052 | 10/1976 | Hunter | 307/270 |
| 4,334,263 | 6/1982 | Adachi | 129/207 |
| 4,393,316 | 7/1983 | Brown | 307/300 |
| 4,438,411 | 3/1984 | Rubin et al. | 330/289 |

Primary Examiner—William L. Sikes
Assistant Examiner—Toan Tran
Attorney, Agent, or Firm—M. Lee Murrah; V. Lawrence Sewell; H. Fredrick Hamann

[57] ABSTRACT

The switching frequency of switching power supplies using bipolar emitter-follower transistor amplifiers to drive field-effect output transistors is increased from a currently typical frequency of 100 KHz to at least 1.5 MHz. by reducing the heating in the bipolar transistors. The heating, which is caused by the inherent 0.7 volt drop in the base-emitter junction of the bipolar transistor, is eliminated by feeding back from a dual core output transformer, a compensating voltage equal to the junction drop, the feedback winding being wound over only one core, and the output signal windings being wound over both cores. The flux in the feedback winding core of the transformer is limited by means of a diode to keep the feedback voltage substantially the same as the forward voltage of the base-emitter junction of the bipolar transistor. The core of the transformer is temperature compensating to keep the feedback voltage correct over temperature extremes. The input signal is coupled to the input of the emitter-follower transistor through the feedback windings of the transformer so that the feedback voltage is added to the input signal. In this way the emitter voltage on the emitter-follower transistor is forced to drive to the level of the supply voltage, thereby eliminating the base-emitter junction voltage drop from the emitter-collector voltage drop. This increases the efficiency of the emitter-follower amplifier to such a degree that it has many times the power handling capacity. This allows operation at much higher frequencies.

12 Claims, 1 Drawing Sheet

VOLTAGE AND TEMPERATURE COMPENSATED EMITTER-FOLLOWER DRIVER

BACKGROUND OF THE INVENTION

The invention relates to power supplies, and more particularly to switching power supplies.

Switching power supplies are commonly used in situations where size and weight are important considerations. A good example is aviation applications where excessive weight and size of avionics devices limits payloads and the amount of avionics capability which can be installed in an aircraft.

Switching power supplies operate by switching a DC voltage, typically with power field-effect-transistors (FETs) to synthesize an AC waveform. The AC waveform is rectified and filtered to produce a new DC voltage level. By changing either the pulse width or frequency of the switching waveform, the average value of the AC waveform and thus the output DC voltage level can be varied. By feeding back the output voltage level to a control circuit, the switching waveform can be automatically adjusted to provide a desired output voltage level.

One factor in the size of a switching power supply is the switching frequency. It is desirable to switch at higher frequencies for several reasons. First, higher frequencies permit use of smaller transformers and filter capacitors. Second, higher frequencies permit use of resonant switching which requires an FM drive signal. FM switching power supplies require a wide frequency deviation in order to achieve the desired regulation range. The ability to switch at higher frequencies is necessary to cover the regulation range using frequency modulation control.

Unfortunately, power supply switching frequencies are now typically around 100 KHz, and they reach an upper limit of usability around 300 KHz. The limitation is caused by the fact that FET gates are actually fixed-value capacitors. As the frequency increases, the FET gate impedance decreases according to the well-known formula:

$$X_C = \frac{1}{2\pi FC}$$

The Miller effect through the gate/drain capacitance lowers the impedance even more as the FET switches "on". In order to provide the required switching level and speed to the FET gate, the current of the drive signal must increase as frequency increases. An undesirable side effect of increasing the drive current is heating in the bipolar transistors which are normally used in the driver stage. This heating is caused by the inherent 0.7 volt drop in the base-emitter junction of the transistor. Excessive drive power levels obviously lead to failure of drive transistors. Similar problems are associated with field-effect-transistors used as drivers.

It is therefore an object of the present invention to increase the frequency at which FETs can be efficiently and practically switched.

It is another object of the present invention to permit construction of smaller and lighter switching power supplies.

It is a further object of the present invention to permit more efficient switching waveforms to be used in switching power supplies.

It is yet another object of the present invention to alleviate heat failure in bipolar and other transistors used to drive power switching devices in switching power supplies.

Still other objects will become apparent in the following summary and description of a preferred embodiment of the invention.

SUMMARY OF THE INVENTION

The present invention overcomes the limitations of prior bipolar transistor emitter-follower and field-effect-transistor source-follower drivers by feeding back a portion of the output signal to compensate for the inherent forward voltage drop in the base-emitter junction of a bipolar transistor and gate-source junction of a field-effect-transistor. This is accomplished by providing a dual core transformer having input and output windings wound over both cores and a feedback winding wound over only one core. The flux in the feedback core of the transformer is limited by a device having a PN junction to keep the feedback voltage substantially the same as the forward voltage drop in the base-emitter junction of the bipolar drive transistor or gate-source junction of a field-effect-transistor. The thermal non-linearity of the core of the transformer maintains a constant current through the PN junction over temperature, which maintains the correct feedback voltage as the junction changes over temperature. The signal is coupled to the input of the emitter-follower or source-follower transistor through the feedback winding of the transformer so that the feedback voltage is added to the input signal at the base. In this way the emitter voltage on the emitter-follower transistor is allowed to rise to the level of the supply voltage, as the base exceeds the supply voltage by one PN junction drop, thereby eliminating the base-emitter forward voltage drop of the emitter-follower and gate-source forward voltage drop of the source-follower, and the voltage times current associated heating of the transistor. The invention provides the thermal properties of a common-emitter or common-source amplifier while maintaining the speed of the emitter-follower or source-follower amplifier.

BRIEF DESCRIPTION OF THE DRAWINGS

The invention may be more fully understood by reading the following description of a preferred embodiment of the invention in conjunction with the appended drawings wherein.

DETAILED DESCRIPTION OF A PREFERRED EMBODIMENT

Figure 1:
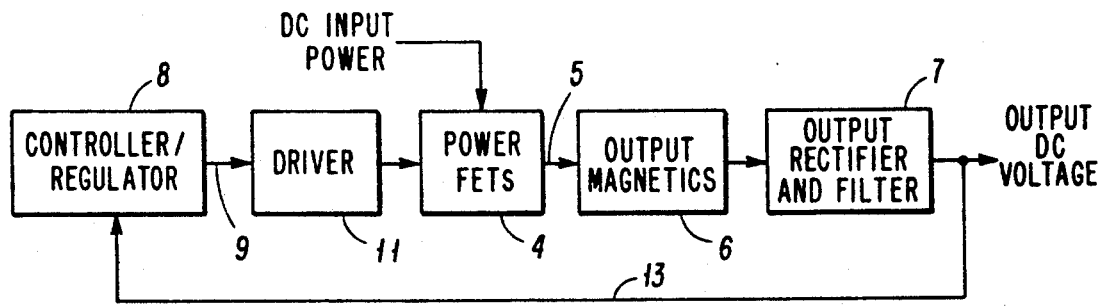
FIG. 1 is a block diagram of a typical switching power supply.

Referring first to FIG. 1, a typical switching power supply uses power FETs 4 to switch INPUT DC POWER to produce a synthesized AC power signal on line 5. The AC power signal is transformed to a desired level by output magnetics 6, which includes one or more transformers and/or inductors. The transformed AC power signal is rectified and filtered in device 7 to produce an OUTPUT DC VOLTAGE and/or voltages. A portion of the OUTPUT DC VOLTAGE is fed back via line 13 to controller/regulator 8. Controller/regulator 8 generates a switching signal on line 9, which typically is either a pulse-width-modulated (PWM) or frequency modulated (FM) pulsed signal that is amplified by a driver 11 to switch power FETs 4. Controller/regulator 8 compares the output voltage on line 18 to a predetermined reference level, and if a discrepancy exists alters the signal fed to driver 11 to change the OUTPUT DC VOLTAGE to the predetermined level. If a PWM switching signal is used, controller/regulator 8 alters the pulse widths; but if an FM switching signal is used, the frequency of the switching signal is altered. The present invention may be utilized in driver 11 to permit the higher driver power levels necessary to increase the frequency of the FET gate drive signal.

Figure 2:
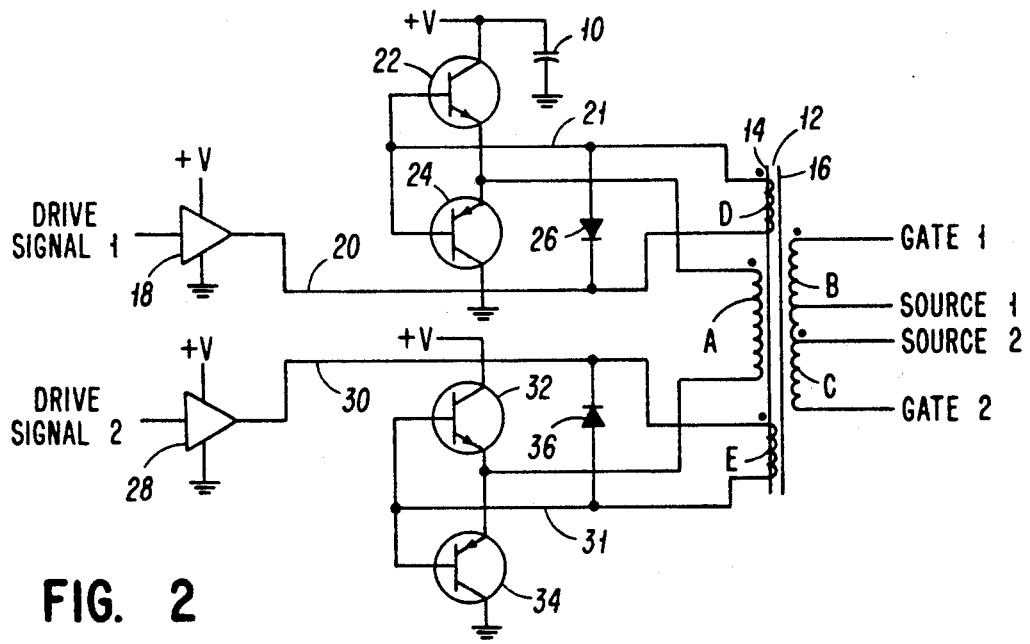
FIG. 2 is a schematic diagram of a driver circuit in which the present invention may be embodied.

Referring to FIG. 2, a drive circuit embodying the present invention is shown. The inputs to the circuit are DRIVE SIGNAL 1 and DRIVE SIGNAL 2 which derive from controller/regulator 8 as shown in FIG. 1; and the outputs are GATE 1, SOURCE 1, GATE 2 and SOURCE 2. Outputs GATE 1 and SOURCE 1 are connected to the gate and source of a first FET in the power FETs section 4 of FIG. 1, and outputs GATE 2 and SOURCE 2 are connected to the gate and source of a second FET, also in the power FETs section 4 of FIG. 1. The various components of the circuit are powered by a DC voltage source V+, which is AC coupled to ground potential, or V−, by a filter capacitor 10.

The various components are coupled in the manner to be described hereinafter through a dual core transformer 12 having cores 14 and 16. Transformer 12 is wound with five windings labelled A, B, C, D and E. Primary winding A and secondary windings B and C are wound over both cores 14 and 16. The two leads of winding B are coupled to the lines GATE 1 and SOURCE 1, while the two leads of winding C are coupled to the lines GATE 2 and SOURCE 2 which represent power FETs of any number in a push-pull arrangement. Both windings D and E are wound over only core 14.

DRIVE SIGNAL 1 is coupled through a buffer 18 to a line 20. Buffer 18 may, for example, be a driver or it may be a level shifter to shift from, say, 5 volt logic to, say, 15 volt logic. The signal on line 20 is coupled to the undotted lead of transformer winding D, and the dotted lead of winding D is coupled via line 21 to the bases of a pair of bipolar transistors 22 and 24 configured as a push-pull emitter-follower amplifier. In the alternative, transistors 22 and 24 may also be field-effect-transistors in a source-follower configuration. A diode 26 is coupled between the dotted and undotted leads of winding D with the cathode directed toward the undotted lead. The collector of NPN transistor 22 is coupled to voltage V+, and the emitter thereof is coupled to the emitter of PNP transistor 24 and is the output of the DRIVE SIGNAL 1 amplifier. The collector of transistor 24 is coupled to ground potential, or V−.

DRIVE SIGNAL 2 is coupled through a buffer 28 to a line 30. Like buffer 18, buffer 28 may also a driver, a level shifter, or the like. The signal on line 30 is coupled to the dotted lead of transformer winding E, and the undotted lead of winding E is coupled via line 31 to the bases of a pair of bipolar transistors 32 and 34 configured as a push-pull emitter follower amplifier. In the alternative, transistors 32 and 34 may also be field-effect-transistors in a source-follower configuration. A diode 36 is coupled between the dotted and undotted leads of winding D with the cathode directed toward the dotted lead. The collector of NPN transistor 32 is coupled to voltage V+, and the emitter thereof is coupled to the emitter of PNP transistor 34 and is the output of the DRIVE SIGNAL 2 amplifier. The collector of transistor 34 is coupled to ground potential, or V−.

The two sets of transistors 22/24 and 32/34 are coupled together through transformer winding A. The commonly-coupled emitters of transistors 22 and 24 are coupled to the dotted lead of winding A, while the commonly-coupled emitters transistors 32 and 34 are coupled to the undotted lead of winding A.

Figure 3A:
FIGS. 3A-3C are graphs of typical driver signals used in the circuit of FIG. 2.
Figure 3B:
Figure 3C:
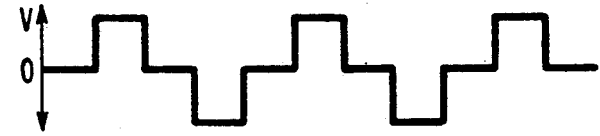

In operation, DRIVE SIGNAL 1 and DRIVE SIGNAL 2 are driven by waveforms which when combined in the transformer, form a symmetrical output waveform in windings B and C of transformer 12. For example, the waveforms shown in FIGS. 3A–C may be used. The waveforms of FIGS. 3A and 3B are both positive-going pulses and are phased so as to provide regular alternating pulses of opposite polarities to DRIVE SIGNAL 1 and DRIVE SIGNAL 2. The pulses may either be pulse-width-modulated or frequency modulated to alter the output voltage of the switching power supply. When combined, the waveforms of FIGS. 3A and 3B produce the symmetrical AC pulse waveform of FIG. 3C. DRIVE SIGNAL 1 pulses drive FET 1 gate on and the DRIVE SIGNAL 2 pulses drive FET 2 gate on. To correct for small dissymmetries, a coupling capacitor (not shown) may be used in series with winding A. If a symmetrical waveform is not used, transformer 12 will saturate and not function properly.

When the voltage of DRIVE SIGNAL 2 goes "high", line 30 also goes "high". This signal feeds directly through winding E to the bases of transistors 32 and 34. The emitter-follower 32 drives the undotted end of winding A high. The signal from winding E forward biases diode 36, which limits the flux excursion of core 14 and limits the voltage at windings D and E to one PN junction voltage, or approximately 0.7 volts at room temperature for silicon devices. The voltage of winding E is then added to the line 30 voltage which is at V+. The signal at the base of transistor 32 is then V+ plus one junction voltage. The emitter of transistor 32 then drives to one (base-emitter) junction voltage lower or to V+. At the same time, a one PN junction voltage generated by winding D back-biases diode 26 and adds to the low signal on line 20, which drives the bases of transistors 22 and 24 below ground, or V−, by one junction voltage. Transistor 24 pulls the dotted end of winding A all the way to ground potential, eliminating the normal forward drop of emitter follower transistor 24 and the associated heat generation. The limiting diodes, 26 and 36, are chosen to closely match the transistors in forward voltage drop. They may be transistors although that degree of precision is not required. Transistors used as diodes also have excessively slow reverse recovery time which would adversely affect the circuit operation.

Addition of the 0.7 volts by the aforementioned feedback to DRIVE SIGNAL 2 permits the emitter voltage on transistor 32 to drive to the level of supply voltage V+. Without addition of the feedback voltage, the emitter-collector voltage includes a drop of 0.7 volts due to the inherent forward bias drop of the base-emitter junction of the transistors. This drop represents an EI power generation which is the source of unwanted device heating of the transistors and power loss. Addition of feedback voltage in the amount of the inherent voltage drop in the transistors compensates for the losses and eliminates the heating effect. The feedback is also positive feedback which increases the gain of the emitter-follower amplifier to more than the normal gain of one. This increases the switching speed of the amplifier so that rise and fall times are faster at the output then at the input.

The portion of the circuit associated with transistors 22 and 24 operates similarly. When the voltage of DRIVE SIGNAL 1 goes "high", line 20 also goes "high". This signal feeds directly through winding D to the bases of transistors 22 and 24. Emitter-follower transistor 22 then drives the dotted end of primary winding A high. The signal from winding D forward biases diode 26 which limits the flux excursion of core 14 in the opposite polarity as with that of the DRIVE SIGNAL 2. The voltage at windings D and E is limited to the voltage of one forward biased PN junction. The voltage of winding D is added to the line 20 voltage which is at V+. The signal at the base of transistor 22 is then V+ plus one junction voltage. The emitter of the transistor 22 then drives one (base-emitter) junction voltage lower or to V+. At the same time, a one PN junction voltage at winding E back-biases diode 36 and adds to the low signal on line 30, which drives the bases of transistors 32 and 34 below ground, or V−, by one junction voltage. Transistor 34 drives the undotted end of winding A all the way to ground potential, eliminating the normal forward drop of the emitter-follower transistor 34 and the associated heat generation.

In an alternative configuration, diode 26 could be removed from its location as shown in FIG. 2 and placed in parallel with diode 36 across winding C, or vice versa. Both diodes 26 and 36 could also be reversed.

According to the invention the voltage to tranformer 12 primary winding A is increased by the amount of two PN junction voltage drops. This allows the turns ratio of transformer 12 to be adjusted to advantage while maintaining the desired drive voltage to GATE 1 and GATE 2. With the adjusted ratio, amplifier transistors 22, 24, 32 and 34 have to provide less current for any given gate load reflected through the improved ratio. This further reduces the heating of the amplifer transistors.

The drive voltage to GATE 1 and GATE 2 is constant over temperature extremes whereas the conventional emitter-follower output varies as the base-emitter voltage drop varies. This allows the ratio of transformer 12, to be adjusted to even further advantage because the output no longer has a worst case variation that must be designed around. Therefore, the drive voltage to GATE 1 and GATE 2 can be closer to the actual gate threshold without concern that it will vary below the threshold at a temperature extreme. Drive transistors 22, 24, 32 and 34 are required to provide even less power, which further reduces heating.

Transformer 12 is wound on two cores. The primary A and secondaries B and C are wound on both cores so that each turn goes around both cores. They are always coupled together exactly by the turns ratio less the leakage inductance. The identical cores divide the flux equally until the flux in core 14 is limited by diode 26 or 36. All of the increase above the limit is in core 16 only. The flux difference between the two cores after limiting represents the inductance which supplies the current to the limiting diodes 26 and 36 and the bases of transistors 22, 24, 32 and 34. The cores 14 and 16 are selected to be non-linear, which causes the inductance difference to stay about the same, as the limit voltage changes from approximately 0.4 to 1.2 volts over temperature extremes. This maintains a near constant current through the limiting diodes 26 and 36, and they closely track changing base-emitter drop of the transistors 22, 24, 32 and 34 over temperature. The effect of a non-linear core over temperature is normally parasitic only, whereas here it is used to cancel the changing voltage over temperature of the PN junction, which is another circuit parasitic.

It can be seen that the DRIVE SIGNAL 1 is of the correct polarity at GATE 1 and DRIVE SIGNAL 2 is of correct polarity at GATE 2 for both to drive "N" channel power FETs. The drive signal in transformer 12 never has a DC component. When using two transformers, one for each DRIVE SIGNAL, there is always a DC component requiring a coupling capacitor. This DC component changes as the controller adjusts the pulse width or frequency, and the driver has to slew the DC voltage on the coupling capacitors. This limits the power supply to only slow line and load changes. The circuit of FIG. 2 can make full modulation changes, end-stop to end-stop, in a single cycle of operation. Using the present invention, a switching frequency of 1.5 MHz has been achieved while driving 4 large power FETs. In addition, an FM drive signal having a frequency range from 82 KHz. to 1.5 MHz. has been achieved without the need to heatsink the driver transistors.

While particular embodiments of the present invention have been shown and described, it should be clear that changes and modifications may be made to such embodiments without departing from the true scope and spirit of the invention. It is intended that the appended claims to cover all such changes and modifications.

What is claimed is:

1. An emitter-follower driver for a power switching device, comprising:

a transformer having input, output and feedback windings;

input means for receiving a varying drive signal;

means for coupling the drive signal to the feedback winding of the transformer;

a bipolar transistor amplifier, having an input and an output, arranged in an emitter-follower configuration, the input of the amplifier being coupled to said feedback winding, and the output of the amplifier being coupled to the input winding of said transformer; and means coupled to said transformer and the transistor amplifier for limiting voltage or current across said feedback winding to continuously generate across said feedback winging a feedback voltage of substantially the same level as the forward bias on the base-emitter junction of a transistor in said transistor amplifier.

2. An emitter-follower driver for a power switching device as described in claim 1 wherein said transformer has a plurality of cores, said input and output windings are wound over more than one of said cores, and said feedback winding is wound over fewer cores than said input and output windings.

3. An emitter-follower driver for a power switching device as described in claim 2 wherein said limiting means comprises a PN junction device coupled between the leads of said feedback windings of said transformer;

4. An emitter-follower driver for a power switching device as described in claim 3 wherein said PN junction device is arranged to limit the level of the signal fed back to the said transistor amplifier from said feedback winding.

5. An emitter-follower driver for a power switching device as described in claim 4 wherein said feedback winding of said transformer is coupled to the input of said transistor amplifier, and said feedback voltage is added to the signal applied to the input of said amplifier to cause the output of said amplifier to drive to substantially the same level as the supplying voltage and its reference level.

6. An emitter-follower driver for a power switching device as described in claim 2 wherein said cores of said transformer are temperature non-linear to maintain a substantially constant current through said limiting means.

7. An emitter-follower driver for a power switching device, comprising:
- a transformer having first and second cores, input and output windings wound over both first and second cores and a feedback winding wound over said first core, said cores having a temperature compensating non-linearity;
- means for generating a drive signal;
- means for coupling the drive signal to a first lead of the feedback winding of the transformer;
- a bipolar transistor amplifier, having an input and an output, arranged in an emitter-follower configuration, the input of the amplifier being coupled to a second lead of said feedback winding, and the output of the amplifier being coupled to one lead of the input winding of said transformer; and
- a PN junction device coupled to said feedback winding for limiting flux in said first core to proved across said feedback winding a feedback voltage of substantially the same level as the forward bias of the base-emitter junction of a transistor in said transistor amplifier.

8. An emitter-follower driver for a power switching device, comprising:
- a transformer having primary, secondary, and first and second feedback windings;
- means for generating first and second drive signals;
- means for coupling the first derive signal to the first feedback winding of the transformer;
- a first bipolar transistor amplifier arranged in an emitter-follower configuration, an input of the first amplifier being coupled to said first feedback winding, and an output of the first amplifier being coupled to the primary winding of said transformer;
- means for coupling the second drive signal to the second feedback winding of the transformer;
- a second bipolar transistor amplifier arranged in an emitter-follower configuration, an input of the second amplifier being coupled to said second feedback winding, and an output of the second amplifier being coupled to the primary winding of said transformer; and
- means coupled to said first and second amplifiers for limiting the voltage across said first and second feedback windings and for generating across said first and second feedback windings a feedback voltage of substantially the same level as the forward bias on a base emitter junction in each of said transistor amplifiers.

9. An emitter-follower driver for a power switching device as described in claim 8 wherein said transformer has two cores, said input and output winding are wound over both of said two cores and said first and second feedback windings are wound over only one of said cores.

10. An emitter-follower driver for a power switching device as described in claim 9 wherein said first and second drive signals are pulses and are phased to alternately provide pulses to said first and second coupling means.

11. An emitter-follower driver for a power switching device as described in claim 10 wherein said first and second drive signals are pulse width modulated.

12. An emitter-follower driver for a power switching device as described in claim 10 wherein said first and second drive signals are frequency modulated.

* * * * *